(12) United States Patent
Sternberg et al.

(10) Patent No.: US 7,639,644 B2
(45) Date of Patent: Dec. 29, 2009

(54) METHOD AND APPARATUS FOR PROVIDING FAST DETECTION OF A HIGH SPEED SHARED CONTROL CHANNEL

(75) Inventors: Gregory S. Sternberg, Mt. Laurel, NJ (US); Yingming Tsai, Boonton, NJ (US); Philip J. Pietraski, Huntington Station, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 497 days.

(21) Appl. No.: 11/350,454

(22) Filed: Feb. 9, 2006

(65) Prior Publication Data

US 2006/0126548 A1 Jun. 15, 2006

Related U.S. Application Data

(63) Continuation of application No. 10/903,389, filed on Jul. 30, 2004, now Pat. No. 7,054,288.

(60) Provisional application No. 60/544,699, filed on Feb. 13, 2004.

(51) Int. Cl.
*H04W 4/00* (2009.01)
(52) U.S. Cl. .................. 370/329; 370/341; 370/438
(58) Field of Classification Search ............. 370/431, 370/438, 310, 328, 329, 342, 340, 341, 439, 370/441, 442; 714/699, 746, 752, 774, 758, 714/786, 795; 455/403, 422.1, 450, 39, 500, 455/507, 509
See application file for complete search history.

(56) References Cited

U.S. PATENT DOCUMENTS 6,871,313 B2 3/2005 Gopalakrishnan

| | | | |
|---|---|---|---|
| 7,054,288 B2 * | 5/2006 | Sternberg et al. | 370/329 |
| 2003/0189918 A1 | 10/2003 | Das et al. | |
| 2003/0192003 A1 | 10/2003 | Das et al. | |
| 2003/0192004 A1 | 10/2003 | Gopalakrishnan | |
| 2003/0210668 A1 | 11/2003 | Malladi et al. | |

(Continued)

FOREIGN PATENT DOCUMENTS

JP 11-136727 5/1999

(Continued)

OTHER PUBLICATIONS

"Performance of the HS-SCCH", Lucent Technologies, 3GPP TSG-RAN WG1#25, R1-02-0649, Apr. 2002.*

(Continued)

*Primary Examiner*—Seema S Rao
*Assistant Examiner*—Khoa Huynh
(74) *Attorney, Agent, or Firm*—Volpe and Koenig, P.C.

(57) ABSTRACT

A method and apparatus for providing fast detection of a high speed shared control channel (HS-SCCH). The HS-SCCH carries information necessary for receiving data via a high speed downlink shared channel (HS-DSCH). The apparatus receives messages transmitted via a plurality of HS-SCCHs. The apparatus measures a channel quality for the messages received via each HS-SCCH. The apparatus performs a threshold test by comparing the channel quality with a predetermined threshold. The apparatus then selects a HS-SCCH having the best channel quality among the HS-SCCHs.

14 Claims, 3 Drawing Sheets

U.S. PATENT DOCUMENTS

| | | | |
|---|---|---|---|
| 2004/0001428 A1* | 1/2004 | Datta et al. | 370/208 |
| 2004/0077368 A1 | 4/2004 | Anderson | |
| 2004/0243903 A1 | 12/2004 | Pan et al. | |
| 2005/0066260 A1 | 3/2005 | Natori | |
| 2005/0078648 A1 | 4/2005 | Nilsson | |

FOREIGN PATENT DOCUMENTS

| | | |
|---|---|---|
| JP | 2003-318745 | 11/2003 |

OTHER PUBLICATIONS

Arnarb Das et al., "Evolution of UMTS Toward High-Speed Downlink Packet Access", Bell Labs Technical Journal 7(3), 2003, pp. 47-68.*

3rd Generation Partnership Project; Technical Specification Group Radio Access Network; "Physical channels and mapping of transport channels onto physical channels (TDD) (Release 5)", 3GPP TS 25.221, v5.5.0, Jun. 2003.*

GPP, $3^{rd}$ Generation Partnership Project, Technical Specification Group Radio Access Network, Physical Channels and Mapping of Transport Channels onto Physical Channels (FDD) (Release 1999), 3G TS 25.211, v3.2.0, Mar. 2000.

$3^{rd}$ Generation Partnership Project; Technical Specification Group Radio Access Network; Physical channels and mapping of transport channels onto physical channels (FDD) (Release 1999); 3G TS 25.211 V3.2.0 (Mar. 2000).

Das et al., "Evolution of UMTS Toward High-Speed Downlink Packet Access," Bell Labs Techincal Journal 7(3), pp. 47-68 (2003).

Lucent Technologies, "Performance of the HS-SCCH," 3GPP TSG-RAN WG1 #25, R1-02-0649 (Apr. 2002).

Third Generation Partnership Project, "Technical Specification Group Radio Access Network, Physical Channels and mapping of transport channels onto phsyical channels (TDD) (Release 5)," 3GPP TS 25.221 V5.5.0 (Jun. 2003).

* cited by examiner

US 7,639,644 B2

METHOD AND APPARATUS FOR PROVIDING FAST DETECTION OF A HIGH SPEED SHARED CONTROL CHANNEL

CROSS REFERENCE TO RELATED APPLICATION

This application is a continuation of U.S. patent application Ser. No. 10/903,389 filed Jul. 30, 2004, which issued as U.S. Pat. No. 7,054,288 on May 30, 2006, which claims the benefit of U.S. Provisional Application No. 60/544,699 filed on Feb. 13, 2004, which is incorporated by reference as if fully set forth.

FIELD OF INVENTION

The present invention is related to a wireless communications. More particularly, the present invention is related to a method and apparatus for providing fast detection of a high speed shared control channel (HS-SCCH).

BACKGROUND

High speed downlink packet access (HSDPA) has been introduced in Release 5 of the third generation partnership project (3GPP) standards. HSDPA requires additional uplink and downlink control signaling to support hybrid automatic repeat request (H-ARQ) and adaptive modulation and coding (AMC). AMC is a form of link adaptation wherein the modulation type, either QPSK or 16-QAM, and coding rate are chosen based on channel quality estimates reported by a wireless transmit/receive unit (WTRU).

One of the problems experienced in the operation of AMC and H-ARQ techniques is delay in the feedback loop. In order to resolve delay problems, the downlink control signaling, which is carried on a HS-SCCH, is staggered in time with respect to a high speed-downlink shared channel (HS-DSCH), which carries the bulk of the data. FIG. 1 shows a prior art timing relationship between the HS-SCCH and the HS-DSCH. Both the HS-SCCH and the HS-DSCH include a three time slot frame which is approximately two (2) milliseconds. One time slot is overlapped between the HS-SCCH and the HS-DSCH.

A HS-SCCH carries the following information: 1) channelization-code-set information; 2) modulation scheme information; 3) transport-block size information; 4) H-ARQ process information; 5) redundancy and constellation version; 6) new data indicator; and 7) WTRU identity. The channelization-code-set information and the modulation scheme information are time critical in configuring a receiver for demodulating data received through the HS-DSCH. This information must be demodulated or buffered prior to complete reception of the data via the HS-DSCH.

A cyclic redundancy check (CRC) is employed for a high degree of confidence in determining if the WTRU is scheduled for a HS-DSCH downlink. However, since the CRC is calculated based on the entire two (2) millisecond HS-SCCH sub-frame, the CRC cannot be used until the WTRU has received the entire HS-SCCH sub-frame, while the WTRU has already begun receiving data through the HS-DSCH.

The data received through the HS-DSCH may be simply buffered during every HS-SCCH sub-frame until the CRC can be verified, and then may be discarded in the event that the HS-SCCH is not directed to a particular WTRU. However, this approach has two major disadvantages. First, the power consumed for buffering the received data at chip rate for potential demodulation is significant. The WTRU has to consume power during all sub-frames, even though no HS-DSCH is scheduled for the WTRU. Second, there are strict timing requirements enforced on the decoding of the HS-DSCH in the WTRU which requires fast generation of an acknowledgment or negative-acknowledgement. The budget of time allotted for decoding the HS-DSCH is eroded by the additional buffering delay needed to utilize the HS-SCCH CRC in configuring a HS-DSCH demodulator.

Therefore, there is a need for a method and apparatus which provide faster detection of the HS-SCCH before receipt of data via the HS-DSCH.

SUMMARY

The present invention is related to a method and apparatus for providing fast detection of a HS-SCCH. The HS-SCCH carries information necessary for receiving data via a HS-DSCH. The apparatus receives messages transmitted via a plurality of HS-SCCHs. The apparatus measures a channel quality, preferably a bit error rate and an accumulated soft metric, of messages received via each HS-SCCH. The apparatus performs a threshold test by comparing the channel quality with a predetermined threshold. The apparatus then selects one of the HS-SCCHs based on the measured channel quality for further processing. When more than one soft metric exceeds the soft metric threshold and are close in value, preference may be given to one of the soft metrics if it had been previously used on the last received message. The apparatus may be a WTRU, a base station or an integrated circuit (IC) therein.

BRIEF DESCRIPTION OF THE DRAWINGS

A more detailed understanding of the invention may be had from the following description of a preferred example, given by way of example and to be understood in conjunction with the accompanying drawing wherein.

DETAILED DESCRIPTION OF THE PREFERRED EMBODIMENTS

Figure 1:
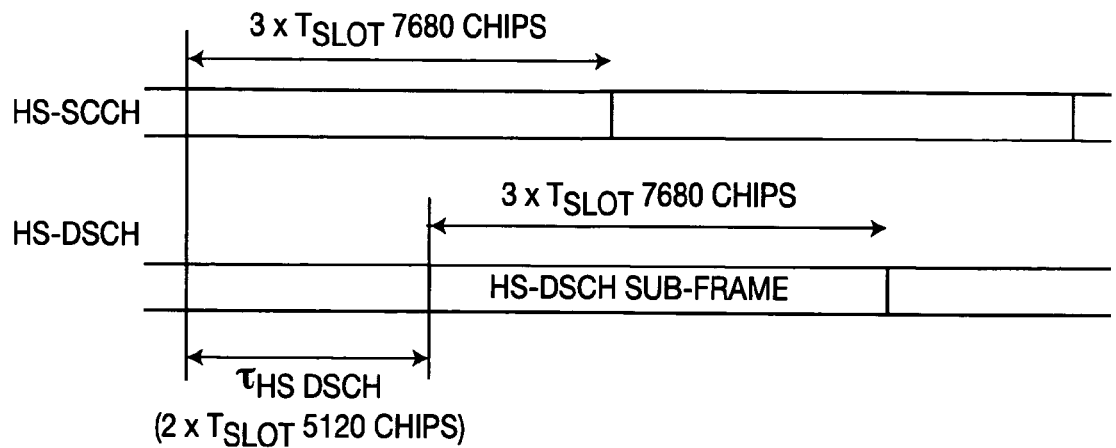
FIG. 1 shows a prior art timing relationship between a HS-SCCH and a HS-DSCH.

The present invention will be described with reference to the drawing figures wherein like numerals represent like elements throughout.

Hereafter, the terminology "WTRU" includes but is not limited to a user equipment (UE), a mobile station, a fixed or mobile subscriber unit, a pager, or any other type of device capable of operating in a wireless environment. When referred to hereafter, the terminology "base station" includes, but is not limited to, a Node-B, a site controller, an access point or any other type of interfacing device in a wireless environment.

The present invention is applicable to Time Division Duplex (TDD), Frequency Division Duplex (FDD), and Time Division Synchronous Code Division Multiple Access (TD-SCDMA), as applied to a Universal Mobile Telecommunications System (UMTS), CDMA 2000 and CDMA in general, but is envisaged to be applicable to other wireless systems as well.

The features of the present invention may be incorporated into an IC or be configured in a circuit comprising a multitude of interconnecting components.

Figure 2:
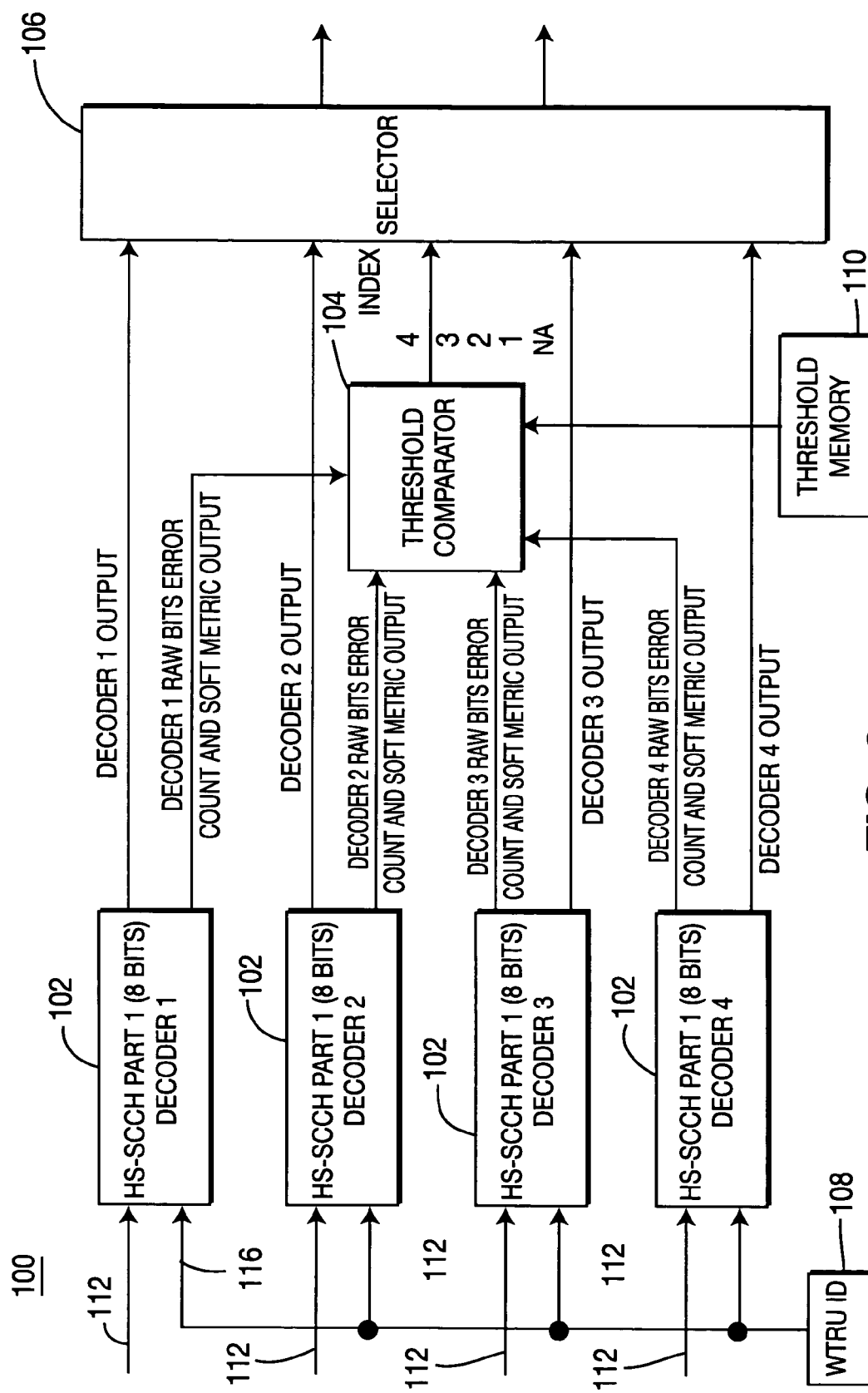
FIG. 2 is a block diagram of an apparatus for providing fast detection of a HS-SCCH in accordance with the present invention.

FIG. 2 is a block diagram of an apparatus 100 for providing fast detection of a HS-SCCH in accordance with the present invention. The system includes a plurality of HS-SCCH decoders 102, a threshold comparator 104, and a selector 106. Four (4) HS-SCCH decoders are preferably used because a WTRU is required to monitor up to four HS-SCCHs under the current 3GPP standard. However, it should be understood that any number of HS-SCCH decoders may be utilized instead of four, and hereinafter the present invention will be described, only as an illustration and not as a limitation, with reference to four (4) HS-SCCH decoders.

Each HS-SCCH decoder 102 receives messages at the first time slot of a sub-frame of each HS-SCCH through a respective input 112. Each HS-SCCH decoder 102 includes a Viterbi decoder 305 and a bit error rate (BER) calculation unit 310, which will be described in detail with reference to FIG. 3 below. Each HS-SCCH decoder 102 generates a BER, and optionally, may further generate an accumulated soft metric on the messages received at the first time slot of the HS-SCCH sub-frame. It should be understood that a BER or an accumulated soft metric are used just as an example of an indicator of a channel quality, and any other parameter that can indicate the degree of correct receipt of a transmitted data without error may be utilized instead of a BER or an accumulated soft metric.

Each HS-SCCH decoder 102 receives a designated WTRU identity (ID) which is stored in a memory 108 of the WTRU. Under the current 3GPP standard, the first field of the sub-frame of a HS-SCCH is masked with a WTRU ID to generate a WTRU-specific masking. The WTRU ID is used in detecting whether the message is directed to a particular WTRU. Each HS-SCCH decoder 102 utilizes the WTRU ID in decoding the message received at the first time slot of the HS-SCCH.

The threshold comparator 104 receives parameters including a BER and/or an accumulated soft metric from each HS-SCCH decoder 102 and performs a threshold test by comparing the parameters to a predetermined BER threshold and/or a soft metric threshold, respectively, which are stored in a threshold memory 110. Each threshold is a configurable parameter depending on operator's preference. The threshold comparator 104 then outputs an index indicating a HS-SCCH having the lowest BER or accumulated soft metric among the HS-SCCHs having passed the threshold test.

The threshold comparator 104 may output one of five possible values including "NA" indicating that no HS-SCCH decoder has passed the threshold test. The output of the threshold comparator 104 is based on whether one of the HS-SCCH decoders 102 has a sufficiently low channel BER, or alternatively low accumulated soft symbol metric, to have high confidence that the HS-SCCH is addressed to the desired WTRU. The selector 106 receives decoder outputs from each HS-SCCH decoder 102 and selects the decoder output having the lowest BER or accumulated soft metric for further processing.

Figure 3:
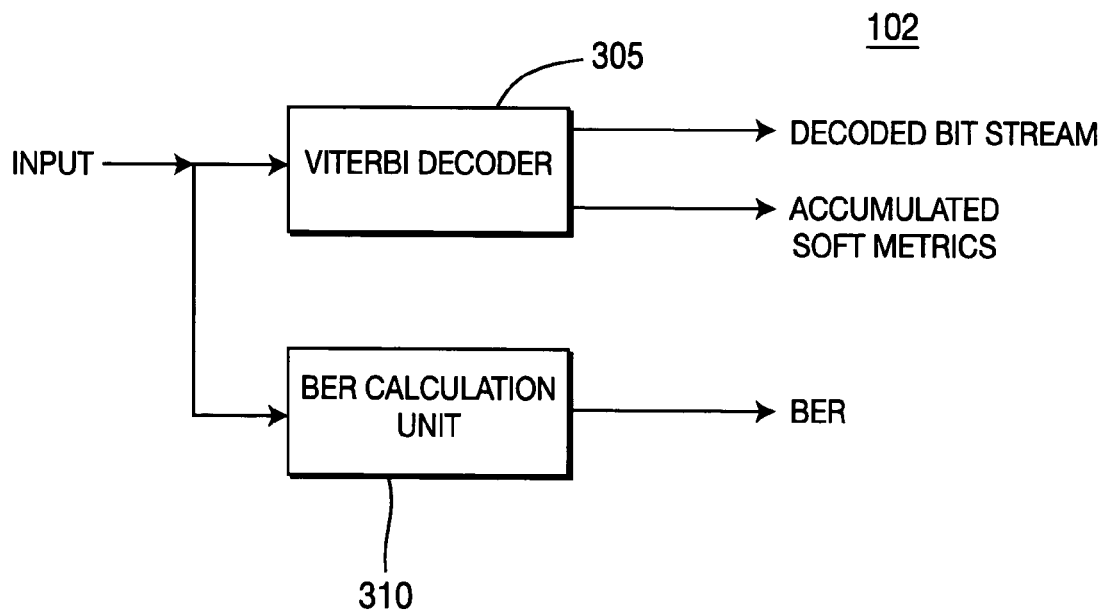
FIG. 3 is a block diagram of a decoder used in the apparatus of FIG. 2.

FIG. 3 is a block diagram of the HS-SCCH decoder 102 used in apparatus 100 in accordance with the present invention. The HS-SCCH decoder 102 comprises a Viterbi decoder 305 and a BER calculation unit 310. The Viterbi decoder 305 is a soft decision decoder which detects originally transmitted bit streams using a Viterbi algorithm. The Viterbi decoder 305 generates an output sequence which is an estimate of transmit bit streams. The Viterbi decoder 305 calculates an accumulated soft metric in each step selecting a surviving path until the last received bit is processed. At the completion of the decoding process, a final accumulated soft metric is determined along with a decoded bit stream. Each Viterbi decoder 305 outputs a decoded bit stream to the selector 106, and one of them may be selected by the selector 106 for further processing.

The BER calculation unit 310 calculates a BER on the received signal. The BER may be calculated by the BER calculation unit 310 using any conventional method. For example, an additional convolutional encoder may be utilized. The output decoded bit streams generated by one of the Viterbi decoders 305 is encoded again and the encoded bit streams are compared with the received bit streams bit by bit for generating bits error count. The received bit streams are stored in a buffer before compared with the re-encoded bit streams. The BER is preferably calculated using the structure of the Viterbi decoder 305.

Figure 4:
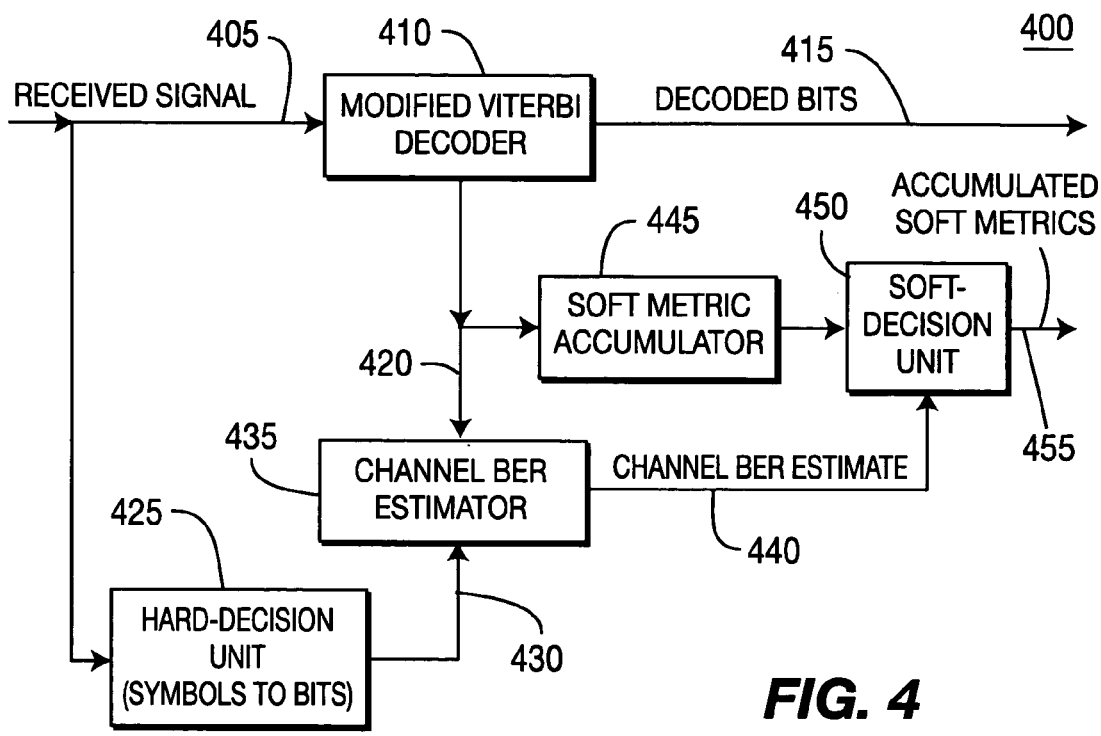
FIG. 4 is an apparatus utilizing a structure of a Viterbi decoder in estimating a bit error rate in accordance with a preferred embodiment of the present invention.

FIG. 4 is an apparatus 400 utilizing a structure of a Viterbi decoder in estimating a bit error for providing fast detection of a HS-SCCH in accordance with a preferred embodiment of the present invention. The apparatus 400 receives a signal 405 for processing and forwards the received signal 405 to a modified Viterbi decoder 410, which outputs decoded bits 415 and an encoded bit sequence estimate 420. A hard-decision unit 425 also receives the signal 405 and outputs a signal 430 to a channel BER estimator 435 which compares the encoded bit sequence estimate 420 with the output signal 430, and outputs a channel BER estimate 440. A soft metric accumulator 445 also receives the encoded bit sequence estimate 420 and, in turn, provides an output to a soft-decision unit 450 which outputs accumulated soft metrics 455.

Alternatively, the threshold comparator 104 may utilize an accumulated soft metric generated by the Viterbi decoder 305 in selecting one of the HS-SCCH decoder outputs. An accumulated soft metric in the Trellis path is calculated in decoding the received bit streams in each Viterbi decoder 305. A final accumulated soft metric is calculated to determine the final surviving path at the completion of decoding process. The accumulated soft metric is input to the threshold comparator 104 to be compared to a soft metric threshold. The threshold comparator 104 outputs an index indicating the HS-SCCH having the lowest accumulated soft metric among those having passed the threshold test. Joint estimation by the Viterbi decoder 305 of the accumulated soft metrics and a BER reduces the latency for HS-SCCH decoding.

Figure 5:
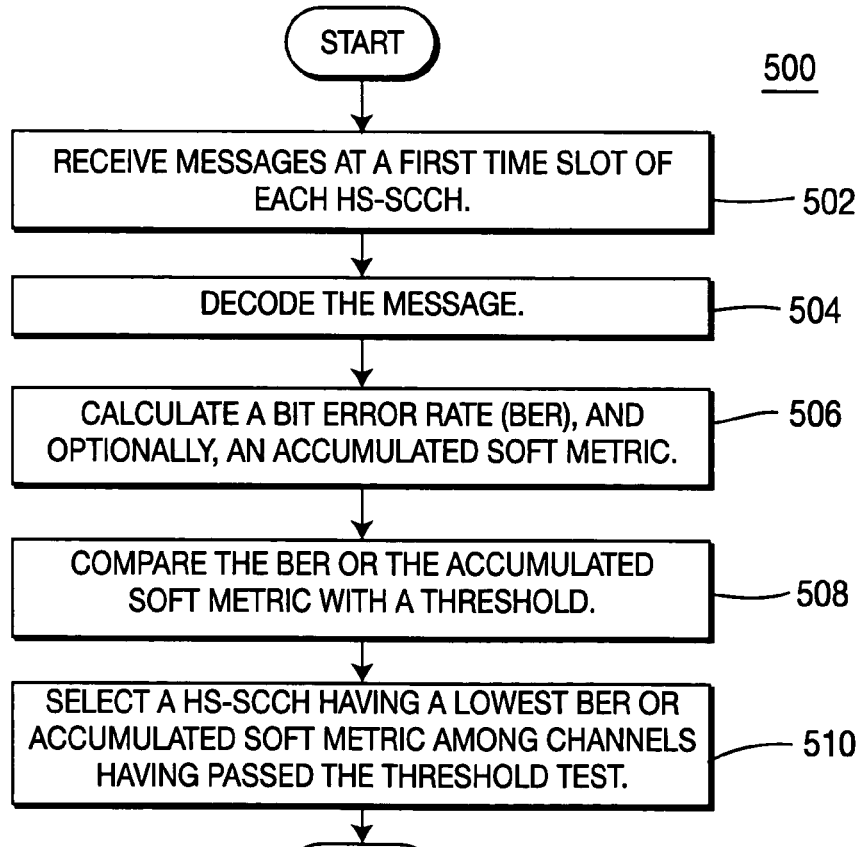
FIG. 5 is a flow diagram of a process including method steps for providing fast detection of a HS-SCCH in accordance with the present invention.

FIG. 5 is a flow diagram of a process 500 including method steps for implementing fast detection of a HS-SCCH in accordance with the present invention. In step 502, a WTRU receives downlink control messages at the first time slot of each of four (4) HS-SCCHs that the WTRU is assigned to monitor. In step 504, the received messages, which are 40 symbols under the current 3GPP standard, are decoded by a HS-SCCH decoder. At the same time, the received bit streams are stored in a memory, and a BER is calculated (step 506). Optionally, an accumulated soft metric may be output by the decoder. In step 508, the BER and/or accumulated soft metric is compared with a predetermined threshold, respectively. If there is any HS-SCCH having passed the threshold test, the WTRU selects one HS-SCCH having the lowest BER or accumulated soft metric (step 510).

In an alternate embodiment, when a plurality of accumulated soft metrics pass the threshold test and are close in value, preference may be given to the HS-SCCH that was previously used to transmit the last received message. The WTRU then receives downlink messages through a HS-DSCH indicated by the HS-SCCH.

With the fast detection algorithm of the present invention, the WTRU may avoid unnecessary power consumption for buffering and processing the HS-DSCH sub-frame. Additionally, the fast detection of a HS-SCCH allows less stringent timing requirements on the decoding of the HS-DSCH.

While this invention has been particularly shown and described with reference to preferred embodiments, it will be understood by those skilled in the art that various changes in form and details may be made therein without departing from the scope of the invention described hereinabove.

What is claimed is:

1. A wireless transmit/receive unit (WTRU) for providing fast detection of a high speed shared control channel (HS-SCCH), the WTRU comprising:
   a plurality of decoders for receiving downlink control messages including a last received downlink control message transmitted via a plurality of monitored HS-SCCHs and calculating an accumulated soft metric for each of the HS-SCCHs;
   a threshold comparator which receives the calculated accumulated soft metrics from the decoders and determines that at least two of the accumulated soft metrics pass a threshold test and are close in value; and
   a selector for selecting a high-speed downlink shared channel (HS-DSCH) indicated by the particular monitored HS-SCCH to receive downlink messages, on a condition that one of the at least two accumulated soft metrics is associated with a particular one of the monitored HS-SCCHs used to receive the last received downlink control message.

2. The WTRU of claim 1 wherein a downlink control message is received at a first time slot of a sub-frame of each HS-SCCH.

3. The WTRU of claim 2 wherein each of the plurality of decoders includes a bit error rate (BER) calculation unit for generating a BER of a respective one of the monitored HS-SCCHs, and the threshold comparator compares each BER to a predetermined threshold to determine which one of the monitored HS-SCCHs has the lowest BER.

4. In a wireless transmit/receive unit (WTRU) for providing fast detection of a high speed shared control channel (HS-SCCH), an integrated circuit (IC) comprising:
   a plurality of decoders for receiving downlink control messages including a last received downlink control message transmitted via a plurality of monitored HS-SCCHs and calculating an accumulated soft metric for each of the HS-SCCHs;
   a threshold comparator which receives the calculated accumulated soft metrics from the decoders and determines that at least two of the accumulated soft metrics pass a threshold test and are close in value; and
   a selector for selecting a high-speed downlink shared channel (HS-DSCH) indicated by the particular monitored HS-SCCH to receive downlink messages, on a condition that one of the at least two accumulated soft metrics is associated with a particular one of the monitored HS-SCCHs used to receive the last received downlink control message.

5. The IC of claim 4 wherein a downlink control message is received at a first time slot of a sub-frame of each HS-SCCH.

6. The IC of claim 4 wherein each of the plurality of decoders includes a bit error rate (BER) calculation unit for generating a BER of a respective one of the monitored HS-SCCHs, and the threshold comparator compares each BER to a predetermined threshold to determine which one of the monitored HS-SCCHs has the lowest BER.

7. A wireless transmit/receive unit (WTRU) for providing fast detection of a high speed shared control channel (HS-SCCH), the WTRU comprising:
   a plurality of decoders configured to receive messages transmitted via a plurality of HS-SCCHs, decode the messages, and generate an accumulated soft metric for each of the HS-SCCHs;
   a threshold comparator configured to perform a threshold test by comparing each of the accumulated soft metrics with a soft metric threshold;
   and a selector configured to select an HS-SCCH having the lowest accumulated soft metric among those HS-SCCHs having an accumulated soft metric lower than the soft metric threshold, wherein a plurality of the accumulated soft metrics pass the threshold test and are close in value, preference is given to the HS-SCCH that was previously used to transmit the last received message.

8. The WTRU of claim 7 wherein the HS-SCCH carries information necessary for receiving data via a high speed-downlink shared channel (HS-DSCH).

9. The WTRU of claim 7 wherein the messages are received at a first time slot of a sub-frame of each HS-SCCH.

10. The WTRU of claim 7 further comprising:
    a bit error rate (BER) calculation unit configured to generate a bit error rate (BER) for each HS-SCCH;
    and wherein the threshold comparator configured to compare each BER to a predetermined threshold to determine the HS-SCCH having the lowest BER.

11. An integrated circuit (IC) for providing fast detection of a high speed shared control channel (HS-SCCH), the IC comprising:
    a plurality of decoders configured to receive messages transmitted via a plurality of HS-SCCHs, decode the messages, and generate an accumulated soft metric for each of the HS-SCCHs;
    a threshold comparator configured to perform a threshold test by comparing each of the accumulated soft metrics with a soft metric threshold;
    and a selector configured to select an HS-SCCH having the lowest accumulated soft metric among those HS-SCCHs having an accumulated soft metric lower than the soft metric threshold, wherein a plurality of the accumulated soft metrics pass the threshold test and are close in value, preference is given to the HS-SCCH that was previously used to transmit the last received message.

12. The IC of claim 11 wherein the HS-SCCH carries information necessary for receiving data via a high speed-downlink shared channel (HS-DSCH).

13. The IC of claim 11 wherein the messages are received at a first time slot of a sub-frame of each HS-SCCH.

14. The IC of claim 11 further comprising:
    a bit error rate (BER) calculation unit configured to generate a bit error rate (BER) for each HS-SCCH;
    and wherein the threshold comparator configured to compare each BER to a predetermined threshold to determine the HS-SCCH having the lowest BER.

* * * * *

UNITED STATES PATENT AND TRADEMARK OFFICE
CERTIFICATE OF CORRECTION

PATENT NO.       : 7,639,644 B2                                      Page 1 of 1
APPLICATION NO.  : 11/350454
DATED            : December 29, 2009
INVENTOR(S)      : Sternberg et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 814 days.

Signed and Sealed this

Twenty-first Day of December, 2010

David J. Kappos
*Director of the United States Patent and Trademark Office*